(12) United States Patent
Jang et al.

(10) Patent No.: US 10,079,109 B2
(45) Date of Patent: Sep. 18, 2018

(54) THIN FILM CAPACITOR

(71) Applicant: SAMSUNG ELECTRO-MECHANICS CO., LTD., Suwon-si, Gyeonggi-do (KR)

(72) Inventors: Su Bong Jang, Suwon-si (KR); Sang Jong Lee, Suwon-si (KR); Hee Soo Yoon, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 22 days.

(21) Appl. No.: 15/432,189

(22) Filed: Feb. 14, 2017

(65) Prior Publication Data

US 2018/0033559 A1     Feb. 1, 2018

(30) Foreign Application Priority Data

Jul. 28, 2016  (KR) .......................... 10-2016-0096237

(51) Int. Cl.
  *H01G 4/33*   (2006.01)
  *H01G 4/012*  (2006.01)
  *H01G 4/018*  (2006.01)

(52) U.S. Cl.
  CPC ............... *H01G 4/33* (2013.01); *H01G 4/012* (2013.01); *H01G 4/018* (2013.01)

(58) Field of Classification Search
  CPC ........... H01G 4/33; H01G 4/012; H01G 4/018
  USPC ....................................... 361/301.4
  See application file for complete search history.

(56) References Cited

U.S. PATENT DOCUMENTS

| | | | |
|---|---|---|---|
| 8,605,410 B2 * | 12/2013 | Oikawa | H01G 4/005 29/25.03 |
| 2004/0125539 A1 * | 7/2004 | Murakami | H01G 4/232 361/306.1 |

FOREIGN PATENT DOCUMENTS

| | | |
|---|---|---|
| JP | 2005-117004 A | 4/2005 |
| JP | 2015-070058 A | 4/2015 |
| JP | 2015-154044 A | 8/2015 |

* cited by examiner

*Primary Examiner* — Michael P McFadden
(74) *Attorney, Agent, or Firm* — McDermott Will & Emery LLP (57) ABSTRACT

A thin film capacitor includes: a body in which first and second internal electrodes and dielectric layers are alternately stacked; and a plurality of first vias disposed in the body and electrically connected to the first internal electrodes and a plurality of second vias disposed in the body and electrically connected to the second internal electrodes. Each of the first and second vias includes two regions on left and right sides of a central portion, the two regions being alternately disposed in a stacking direction.

19 Claims, 5 Drawing Sheets

THIN FILM CAPACITOR

CROSS-REFERENCE TO RELATED APPLICATION(S)

This application claims the benefit of priority to Korean Patent Application No. 10-2016-0096237 filed on Jul. 28, 2016 in the Korean Intellectual Property Office, the entire disclosure of which is incorporated herein by reference.

BACKGROUND

1. Technical Field

The present disclosure relates to a thin film capacitor.

2. Description of Related Art

Recently, in accordance with the thinning of application processors (AP) for smartphones, there has been an increased demand for a thin film capacitor having a thickness lower than that of a multilayer ceramic capacitor (MLCC).

Such a thin film capacitor may be formed to have a reduced thickness using thin film technology, but there may be a limitation in terms of the number of dielectric layers that may be stacked as compared to an MLCC, such that it may be difficult to implement high capacitance therein.

In order to increase capacitance while retaining the same number of stacked internal electrodes, there is a need to increase an effective area of the internal electrodes. Here, in a method of connecting the internal electrodes to each other using a via, since the number of stacked internal electrodes is increased by n layers, and sizes of vias are increased in a stepwise manner, an effective area of a lowermost internal electrode and an effective area of an uppermost internal electrode may be different from each other. Therefore, unlike a multilayer capacitor in which capacitance is increased in proportion to the number of stacked internal electrodes, in a thin film capacitor, capacitance is not increased in proportion to the number of stacked internal electrodes.

Therefore, a method capable of increasing effective areas of a plurality of internal electrodes connected to external electrodes has been required.

SUMMARY

An aspect of the present disclosure may provide a thin film capacitor capable of increasing an effective area of internal electrodes to increase capacitance.

According to an aspect of the present disclosure, a thin film capacitor includes a body in which first and second internal electrodes and dielectric layers are alternately stacked; and a plurality of first vias disposed in the body and electrically connected to the first internal electrodes and a plurality of second vias disposed in the body and electrically connected to the second internal electrodes. Each of the first and second vias includes a region on a left side of a central portion and a region on a right side of the central portion, and the regions are alternately disposed in a stacking direction.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
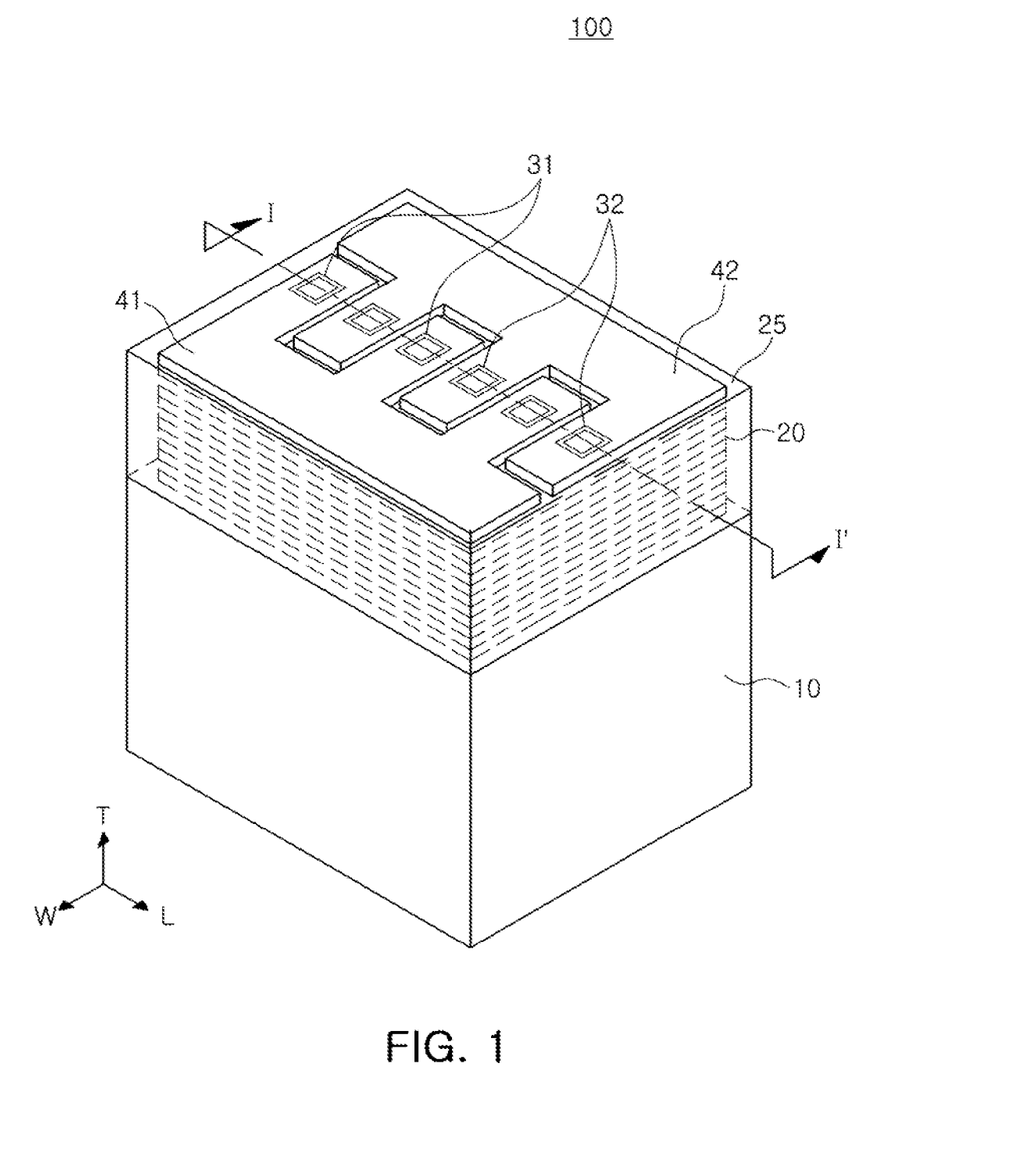
FIG. 1 is a schematic perspective view illustrating a thin film capacitor according to an exemplary embodiment in the present disclosure.

FIG. 1 is a schematic perspective view illustrating a thin film capacitor according to an exemplary embodiment in the present disclosure.

Referring to FIG. 1, a thin film capacitor 100 according to an exemplary embodiment in the present disclosure may include a body 20 in which first and second internal electrodes 21 and 22 and dielectric layers 23 are alternately stacked on a substrate 10, and a plurality of first vias 31 disposed in the body and electrically connected to the first internal electrodes 21 and a plurality of second vias 32 electrically connected to the second internal electrodes 22 and disposed alternatingly with the first vias, wherein each of the first and second vias has a cross section including two regions alternately disposed on left and right sides of a central portion of the via in a stacking direction.

A layer (a substrate) of the substrate 10 contacting the first or second internal electrode 21 or 22 may have insulating properties, and the substrate 10 may be formed of one selected from $Al_2O_3$, $SiO_2$/Si, MgO, $LaAlO_3$, and $SrTiO_3$, but is not limited thereto. The substrate 10 may have sufficient flatness and surface roughness.

Figure 2:
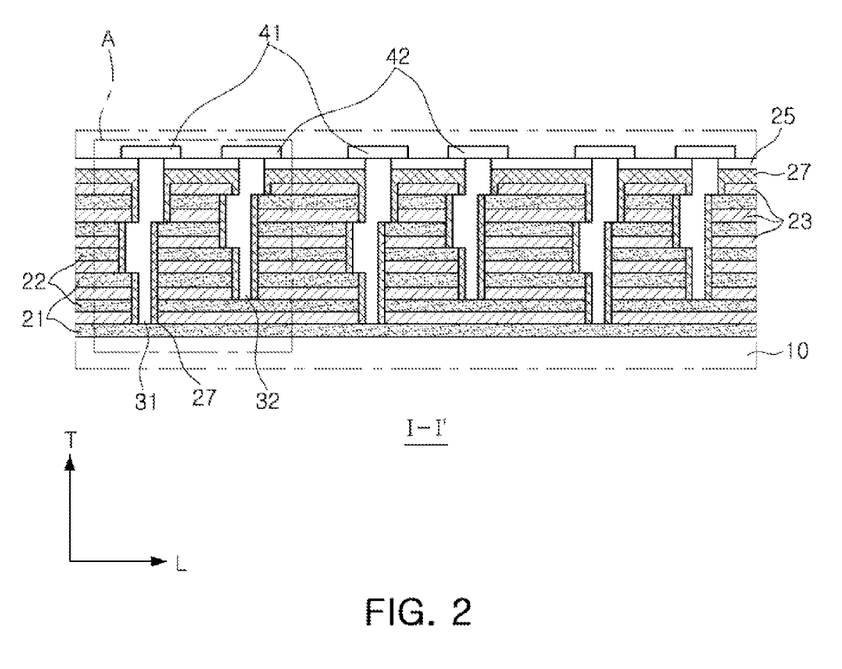
FIG. 2 is a schematic cross-sectional view of the thin film capacitor according to the exemplary embodiment in the present disclosure, taken along line I-I' of FIG. 1.

FIG. 2 is a schematic cross-sectional view of the thin film capacitor according to the exemplary embodiment in the present disclosure, taken along line I-I' of FIG. 1.

Referring to FIG. 2, the body 20 may have a stacked structure in which the first internal electrode 21 is formed on the substrate 10, the dielectric layer 23 is formed on the first internal electrode 21, and the second internal electrode 22 is formed on the dielectric layer 23, and may have a form in which a plurality of first internal electrodes 21 and second internal electrodes 22 are alternately stacked with respective dielectric layers 23 interposed therebetween. However, the numbers of first and second internal electrodes 21 and 22 and dielectric layers 23 are not limited to those illustrated in the drawings.

As the numbers of stacked first and second internal electrodes 21 and 22 and dielectric layers 23 are increased, equivalent series resistance (ESR) of the capacitor may be reduced.

The first and second internal electrodes 21 and 22 may be formed of layers that do not have predetermined patterns.

The first and second internal electrodes 21 and 22 may be formed of a conductive material.

The conductive material may be copper (Cu), aluminum (Al), gold (Au), silver (Ag), platinum (Pt), iridium (Ir), ruthenium (Ru), $IrO_2$, $RuO_2$, or the like, but is not limited thereto.

The first and second internal electrodes 21 and 22 may be formed using a vapor phase synthesis method such as a sputtering method, a vapor deposition method, or the like, and may be processed using a photolithography process or a dry etching process.

High-temperature heat history may be generated in a process of forming a dielectric layer, a thin film having a high dielectric constant. Resultantly, an internal electrode is diffused to the dielectric layer or reacts with the dielectric layer, such that a leakage current may be increased in a capacitor.

The first and second internal electrodes 21 and 22 may be formed of platinum (Pt), a high melting point material, thereby suppressing the internal electrodes from being diffused to the dielectric layer or reacting with the dielectric layer.

The dielectric layer 23 may include a perovskite material, a material having a high dielectric constant.

The perovskite material may be a dielectric material of which a dielectric constant may be significantly changed, such as a barium titanate ($BaTiO_3$)-based material, a strontium titanate ($SrTiO_3$)-based material, a (Ba, Sr) $TiO_3$-based material, a PZT-based material, or the like, but is not limited thereto.

The dielectric layer 23 may be formed by a sol-gel method, a sputtering method, a laser ablation method, or the like.

A surface treatment may be performed on the first and second internal electrodes 21 and 22 or the dielectric layer 23.

The surface treatment, a process of planarizing a surface, may be performed by etching and polishing, and may be, for example, a dry etching method such as an ion beam etching method or a chemical mechanical polishing (CMP) method, but is not limited thereto.

Figure 3:
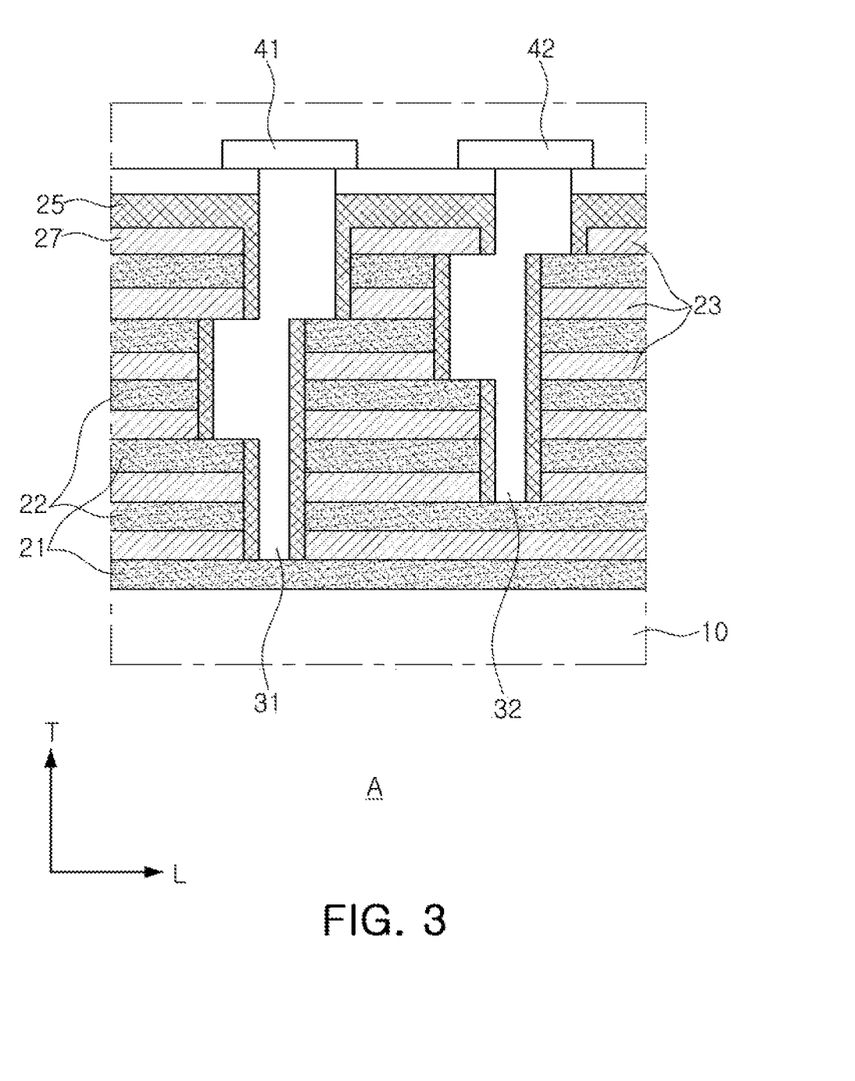
FIGS. 3 and 4 are enlarged views of part A of FIG. 2.
Figure 4:
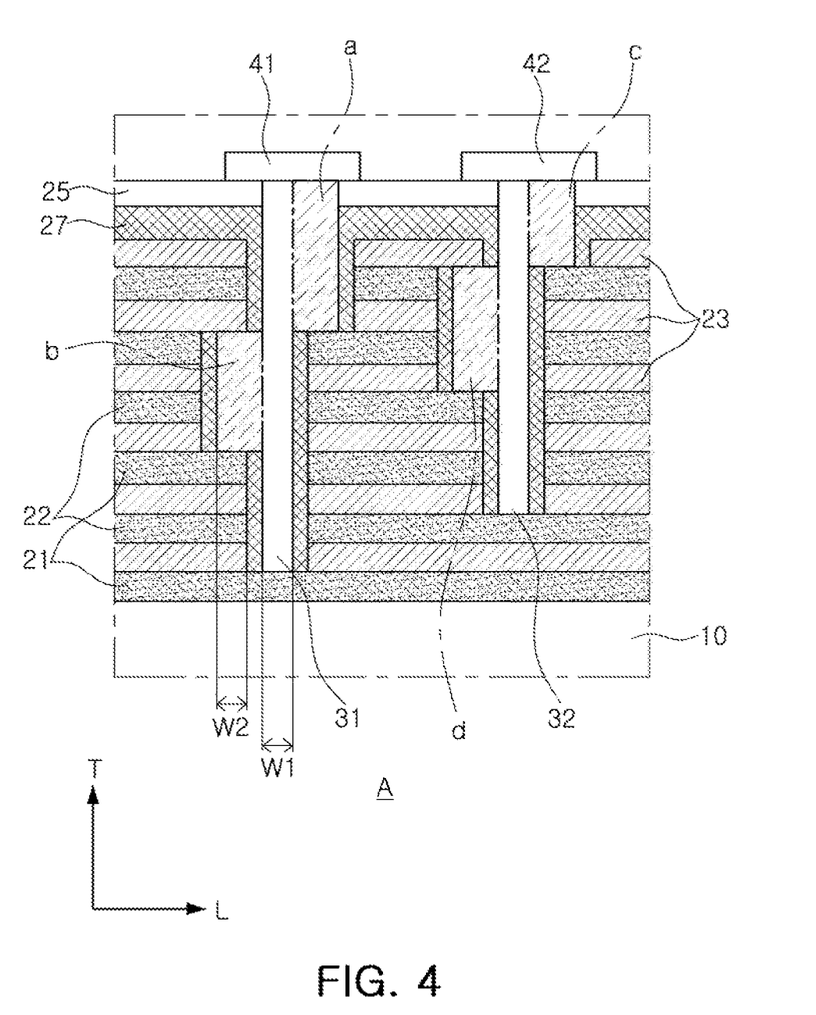
Figure 5:
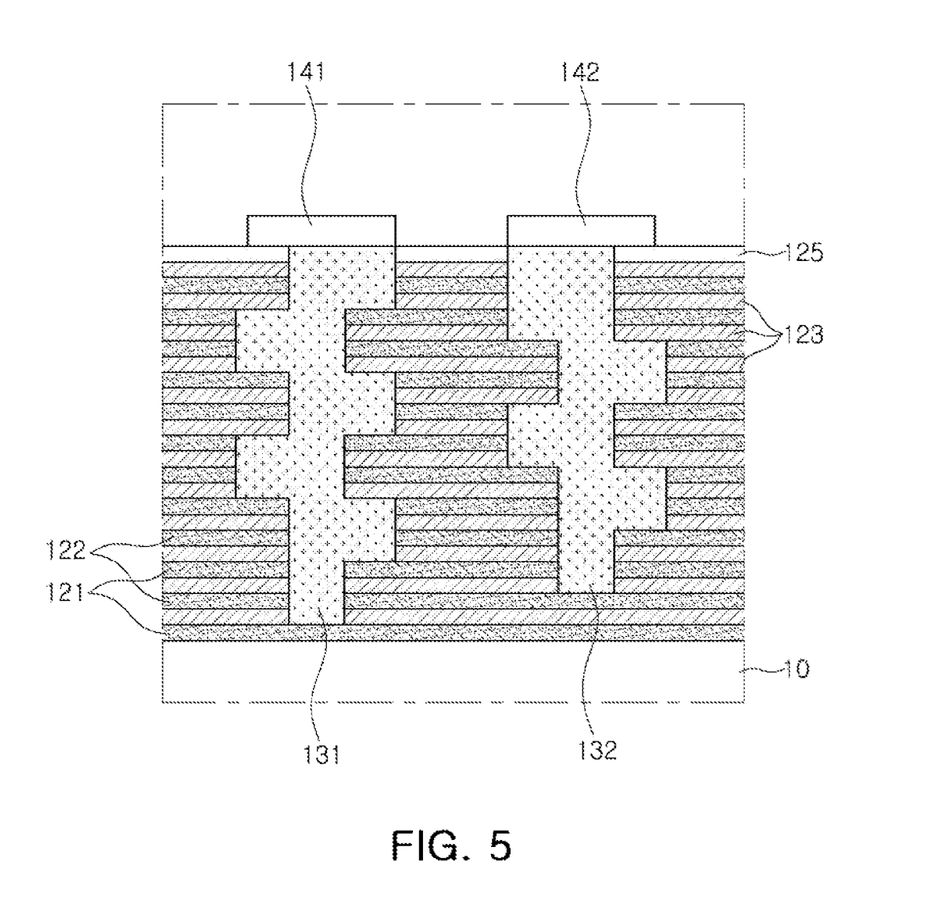
FIG. 5 is an enlarged cross-sectional view of a thin film capacitor according to another exemplary embodiment in the present disclosure.

FIGS. 3 and 4 are enlarged views of part A of FIG. 2; and FIG. 5, an enlarged cross-sectional view of a thin film capacitor according to another exemplary embodiment in the present disclosure, illustrates a thin film capacitor in which numbers of stacked first and second internal electrodes are increased.

In the present disclosure, the first and second polarities refer to different polarities.

Referring to FIGS. 3 through 5, the first vias 31 and 131 may be electrically connected to the first internal electrodes 21 and 121, respectively, and formed to penetrate from one surface of the body to a lowermost first internal electrode, and the second vias 32 and 132 may be electrically connected to the second internal electrodes 22 and 122, respectively, and formed to penetrate from one surface of the body to a lowermost second internal electrode. The first vias 31 and 131 may be electrically insulated from the second vias 32 and 132.

The first and second vias 31, 32, 131, and 132 may be alternately disposed in one direction, and alternately disposed in a zigzag manner on the same line or in one direction.

When a distance between the first and second vias is reduced, currents may be generated in directions in which magnetic inductions are offset against each other, such that magnetic induction may be suppressed. As a current path is decreased, resistance may be decreased, effective in reducing equivalent series resistance (ESR).

The first and second vias 31, 32, 131, and 132 may be formed by alternately forming a plurality of first and second via holes in the body in the stacking direction of the body, and filling the first and second via holes with a conductive material.

A method of filling the conductive material in the first and second via holes may be performed by plating. The first and second via holes may be formed by a laser punching method or a mechanical punching method, but are not limited thereto.

The conductive material may be copper (Cu), aluminum (Al), gold (Au), silver (Ag), platinum (Pt), or the like, but is not limited thereto.

When the first and second vias are formed in plural, contact surfaces of the first and second vias contacting the first and second internal electrodes, respectively, may be increased, which may reduce ESR of the capacitor.

As an effective area of internal electrodes is increased, capacitance of a capacitor may be improved. In a case of connecting electrodes using vias in a thin film capacitor according to the related art, when the number of stacked internal electrodes is increased, via size is increased in a stepwise manner from a lowermost layer to an uppermost layer. That is, as the number of stacked internal electrodes is increased, an area occupied by the via in the internal electrode is increased, and an effective area of a lowermost internal electrode and an effective area of an uppermost internal electrode are different from each other. Therefore, unlike the multilayer ceramic capacitor of which capacitance is increased in proportion to the number of stacked internal electrodes, in the thin film capacitor, capacitance is not increased in proportion to the number of stacked internal electrodes.

Unlike this, according to the exemplary embodiment in the present disclosure, each of the first and second vias 31, 32, 131, and 132 may have a cross section including two regions alternately disposed on left and right sides of a central portion of the via in the stacking direction. The two regions may extend from the central portion of the via to the left and right in a direction perpendicular to the stacking direction. That is, each of the first and second vias may have a cross section including two regions alternately disposed at both sides of the central portion of the via in a diagonal direction.

Referring to FIGS. 3 and 5, each of the first and second vias may have a cross section including two regions alternately disposed on left and right sides of the central portion thereof, such that areas occupied by the via in the other internal electrodes except for the lowermost internal electrode may be the same as each other, and even in the case that the number of stacked internal electrodes is increased, an effective area of the internal electrode may be constant. Therefore, a loss of capacitance may be reduced as compared to the thin film capacitor according to the related art.

TABLE 1

| Classification | Number of Each of First and Second Internal Electrodes | Shape of Cross Section of Via | Capacitance (Cap; nF) | Effective Area ($mm^2$) of Internal Electrode | Change in Capacitance (Δ Cap; %) | Change in Effective Area of Internal Electrode (%) |
|---|---|---|---|---|---|---|
| Comparative Example 1 | 3 | Multistep shape | 82.03 | 2.69 | — | — |

TABLE 1-continued

| Classification | Number of Each of First and Second Internal Electrodes | Shape of Cross Section of Via | Capacitance (Cap; nF) | Effective Area (mm²) of Internal Electrode | Change in Capacitance (Δ Cap; %) | Change in Effective Area of Internal Electrode (%) |
|---|---|---|---|---|---|---|
| Example 1 | | Tetragonal form alternated | 82.58 | 2.70 | 0.67 | 0.67 |
| Comparative Example 2 | 6 | Multistep shape | 167.20 | 5.47 | — | — |
| Example 2 | | Tetragonal form alternated | 185.74 | 6.08 | 11.08 | 11.08 |

Table 1 illustrates effective areas of internal electrodes and capacitances of thin film capacitors (Comparative Examples 1 and 2) according to the related art, having a multistep shape and thin film capacitors (Examples 1 and 2) according to the present disclosure. The thin film capacitors in Comparative Examples 1 and 2 and Examples 1 and 2 had the same size, and the same materials were used therein, but only shapes of cross sections of vias were different from each other.

Referring to Table 1, it may be appreciated that as the numbers of stacked first and second internal electrodes were increased, the effective areas of the internal electrodes and capacitance were increased, and when the numbers of stacked internal electrodes were the same as each other, in Examples 1 and 2, the effective areas of the internal electrodes and capacitance were increased as compared to Comparative Examples 1 and 2.

Particularly, comparing Comparative Example 2 and Example 2, it may be appreciated that in Example 2, the effective area of the internal electrodes and capacitance were increased by 11% as compared to Comparative Example 2. Therefore, it may be appreciated that each of the first and second vias has the cross section including two regions alternately disposed to the left and right of the central portion thereof, such that the effective area of the internal electrodes may be increased, and thus capacitance of the capacitor may be increased.

Referring to FIG. 4, a cross section of the first via may include first and second regions a and b, based on the central portion of the first via, and a cross section of the second via may include third and fourth regions c and d based on the central portion of the second via.

The first region a may be disposed on one side of the central portion of the first via, the second region b may be disposed on the other side of the central portion of the first via in a diagonal direction of the first region. In addition, the third region c may be disposed on one side of the central portion of the second via, the fourth region d may be disposed on the other side of the central portion of the second via in a diagonal direction of the third region.

An area W1 of the lowermost first and second internal electrodes contacting the first and second vias may be the same as an area W2 of the uppermost first and second internal electrodes contacting the first and second vias. That is, areas of the first and second vias contacting each of the layers of the plurality of first and second internal electrodes may be the same as each other.

The first and second internal electrodes 21 and 22 may contact exposed surfaces of the first and second vias 31 and 32. This is due to the shapes of the cross sections of the first and second vias, and an area of the surfaces of each of the layers of the first and second internal electrodes contacting the first and second vias may be constant.

Since the effective area of each of the layers of the internal electrodes and the contact surface with the via are constant due to the above-mentioned structure, even in the case that the number of stacked internal electrodes is increased, a thin film capacitor of which capacitance is improved may be implemented.

Upper surfaces of the first and second vias may have a tetragonal form, but are not limited thereto. Since the first and second vias have a shape in which two regions are alternately disposed on the left and right sides of the central portion thereof, when viewed from above, the first and second vias may have a shape formed by alternately disposing tetragons.

First and second external electrodes 41 and 42 may be formed to connect the first and second vias and first and second electrode pads to each other, respectively.

The first and second external electrodes 41 and 42 may be formed of a conductive material, and may be formed by a plating process.

The conductive material may be copper (Cu), aluminum (Al), gold (Au), silver (Ag), platinum (Pt), or the like, but is not limited thereto.

The first and second electrode pads (not illustrated) may be formed on the first and second external electrodes 41 and 42, and may contain a conductive material such as copper (Cu), aluminum (Al), gold (Au), silver (Ag), platinum (Pt), or the like.

The first and second electrode pads may be disposed in positions in which the first and second electrode pads do not overlap the first and second vias in the stacking direction of the dielectric layers and internal electrodes, respectively, and may solve problems such as a contact defect with an external board and via delamination at the time of mounting the thin film capacitor on a board.

The first and second electrode pads may be integrated with the first and second external electrodes 41 and 42, but are not limited thereto.

Due to a disposition of the first and second vias 31 and 32, the first and second external electrodes 41 and 42 may have comb shapes. The comb shapes of the first and second external electrodes 41 and 42 may be engaged with each other and may be alternately disposed.

In detail, the first external electrode 41 may include a plurality of first connection portions each connected to the plurality of first vias and a first electrode portion connected to the plurality of first connection portions, and the second external electrode 42 may include a plurality of second connection portions each connected to the plurality of second vias and a second electrode portion connected to the plurality of second connection portions.

Since the first and second external electrodes have polarities opposite to each other, as the first and second external electrodes are brought as close to each other as possible, an excellent ESL reducing effect may be secured.

The first electrode portion may be an electrode connecting the plurality of first connection portions to one another, and the second electrode portion may be an electrode connecting the plurality of second connection portions to one another. In this case, the first and second electrode pads may be formed on the first and second electrode portions, respectively.

Insulating layers 27 may be formed in order to allow the first vias 31 and the second vias 32 to be electrically connected to the first internal electrodes 21 and the second internal electrodes 22, respectively, while not being electrically connected to the second internal electrodes 22 and the first internal electrodes 21, respectively.

The insulating layers 27 may be formed between the first vias 31, and the dielectric layers 23 and the second internal electrodes 22, and may be formed between the second vias 32, and the dielectric layers 23 and the first internal electrodes 21.

The insulating layers may secure insulation between the first vias 31 and the second internal electrodes 22 and insulation between the second vias 32 and the first internal electrodes 21, and may be formed on surfaces of the dielectric layers to reduce parasitic capacitance generated in the dielectric layers.

The insulating layer 27 may be formed of an organic material such as benzocyclobutene (BCB), polyimide, or the like, or an inorganic material such as $SiO_2$, $Si_3N_4$, or the like, and may be formed of a material having a dielectric constant lower than that of the dielectric layer 23 in order to increase insulating properties and reduce parasitic capacitance.

The insulating layer may be formed using a chemical vapor deposition (CVD) method that may form a layer having a uniform thickness, even in a complicated three-dimensionally shape.

A protection layer 25 may be formed in order to prevent the body 20 and the first and second external electrodes from being deteriorated or polluted due to external humidity or a chemical reaction with oxygen from the outside and may prevent the body 20 and the first and second external electrodes 41 and 42 from being damaged at the time of mounting the thin film capacitor on the board.

The protection layer 25 may be formed of a material having high heat resistance, for example, an organic thermosetting material or a photocurable material such as polyimide.

The protection layer 25 may be formed by exposure and development processes of a photoresist, a spray application process, a dipping method using a low-viscosity polymer coating solution, and the like, but is not limited thereto.

As set forth above, according to exemplary embodiments in the present disclosure, an effective area of the internal electrodes may be increased by decreasing the area of the via, such that capacitance may be improved.

While exemplary embodiments have been shown and described above, it will be apparent to those skilled in the art that modifications and variations could be made without departing from the scope of the present invention as defined by the appended claims.

What is claimed is:

1. A thin film capacitor comprising:
    a body in which first and second internal electrodes and dielectric layers are alternately stacked on a substrate; and
    a plurality of first vias disposed in the body and electrically connected to the first internal electrodes and a plurality of second vias disposed in the body and electrically connected to the second internal electrodes,
    wherein each of the first and second vias includes a region on a left side of a central portion and a region on a right side of the central portion, and the regions are alternately disposed in a stacking direction.

2. The thin film capacitor of claim 1, wherein the first via includes first and second regions, and the second via includes third and fourth regions,
    the first and third regions being disposed on a first side of the central portions of the first and second vias, respectively, and
    the second and fourth regions being disposed on a second side of the central portions of the first and second vias and spaced apart from the first and third regions, respectively.

3. The thin film capacitor of claim 1, wherein an area of lowermost first and second internal electrodes contacting the first and second vias is the same as that of uppermost first and second internal electrodes contacting the first and second vias, respectively.

4. The thin film capacitor of claim 1, wherein upper surfaces of the first and second vias have a tetragonal form.

5. The thin film capacitor of claim 1, wherein the first and second internal electrodes contact exposed surfaces of the first and second vias, respectively.

6. The thin film capacitor of claim 1, wherein the first and second vias are formed in plural.

7. The thin film capacitor of claim 1, wherein the plurality of first vias is disposed alternately with the plurality of second vias.

8. The thin film capacitor of claim 1, further comprising insulating layers disposed between the plurality of first vias and the second internal electrodes, and between the plurality of second vias and the first internal electrodes.

9. The thin film capacitor of claim 1, further comprising a protection layer disposed on an upper surface of the body.

10. The thin film capacitor of claim 1, wherein a depth of the first via is different from that of the second via.

11. A thin film capacitor comprising:
    a body in which a plurality of dielectric layers and first and second internal electrodes are alternately stacked on a substrate; and
    a plurality of first and second vias disposed in the body;
    wherein each of the first vias is electrically connected to the first internal electrodes and formed to penetrate from one surface of the body to a lowermost first internal electrode, and each of the second vias is electrically connected to the second internal electrodes, and formed to penetrate from one surface of the body to a lowermost second internal electrode, and
    each of the first and second vias includes a region on a left side of a central portion and a region on a right side of the central portion, and the regions are alternately disposed in a stacking direction.

12. The thin film capacitor of claim 11, wherein the first via includes first and second regions, and the second via includes third and fourth regions, the first and third regions being disposed on a first side of the central portions of the first and second vias, respectively, and the second and fourth regions being disposed on a second side of the central portions of the first and second vias and spaced apart from the first and third regions, respectively.

13. The thin film capacitor of claim 11, wherein an area of the lowermost first and second internal electrodes contacting the first and second vias is the same as that of uppermost first and second internal electrodes contacting the first and second vias, respectively.

14. The thin film capacitor of claim 11, wherein the first and second internal electrodes contact exposed surfaces of the first and second vias, respectively.

15. The thin film capacitor of claim 11, wherein the plurality of first vias is disposed alternately with the plurality of second vias.

16. The thin film capacitor of claim 11, further comprising insulating layers disposed between the plurality of first vias and the second internal electrodes, and between the plurality of second vias and the first internal electrodes.

17. The thin film capacitor of claim 11, further comprising a protection layer disposed on an upper surface of the body.

18. A thin film capacitor comprising:
a body in which first and second internal electrodes and dielectric layers are alternately stacked on a substrate; and
a plurality of first vias disposed in the body and electrically connected to the first internal electrodes and a plurality of second vias disposed in the body and electrically connected to the second internal electrodes,
wherein each of the first and second vias has a cross section including a region on a left side of a central portion and a region on a right side of the central portion, and the regions are alternately disposed in a stacking direction.

19. The thin film capacitor of claim 18, wherein a depth of the first via is different from that of the second via.

* * * * *